(12) United States Patent
Kuan et al.

(10) Patent No.: US 9,385,859 B2
(45) Date of Patent: Jul. 5, 2016

(54) MULTI-LANE SERIAL DATA LINK RECEIVER AND METHOD THEREOF

(71) Applicant: Realtek Semiconductor Corp., Hsinchu (TW)

(72) Inventors: Chi-Kung Kuan, Daxi Township, Taoyuan County (TW); Chia-Liang Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/141,496

(22) Filed: Dec. 27, 2013

(65) Prior Publication Data

US 2015/0188694 A1   Jul. 2, 2015

(51) Int. Cl.
| | |
|---|---|
| *H04L 7/00* | (2006.01) |
| *H04L 7/033* | (2006.01) |
| *H04L 25/14* | (2006.01) |
| *H03L 7/099* | (2006.01) |

(52) U.S. Cl.
CPC .............. *H04L 7/033* (2013.01); *H03L 7/0996* (2013.01); *H04L 7/0087* (2013.01); *H04L 25/14* (2013.01); *H04L 7/0337* (2013.01)

(58) Field of Classification Search
CPC ............. H03D 3/24; H03H 7/30; H04B 1/10; H04L 1/00; H04L 7/00; H04L 27/01; H04L 27/06; H04L 27/063; H04L 7/0087; H04L 25/14; H03L 7/0996
USPC ........... 327/89, 141, 144, 155; 370/248, 250; 375/233, 316, 346, 350, 354, 355, 371, 375/375, 376; 455/63.1, 114.2, 296; 708/323
See application file for complete search history.

(56) References Cited

U.S. PATENT DOCUMENTS

| | | | | |
|---|---|---|---|---|
| 6,307,906 B1* | 10/2001 | Tanji | ................... | H03D 13/004 375/375 |
| 6,526,112 B1* | 2/2003 | Lai | ............................ | H03L 7/07 375/375 |
| 7,099,424 B1* | 8/2006 | Chang | ....................... | H03L 7/07 327/277 |
| 8,878,614 B2 | 11/2014 | Yin et al. | | |
| 2001/0033188 A1* | 10/2001 | Aung et al. | ................... | 327/141 |
| 2008/0117984 A1* | 5/2008 | Hao | ....................... | G09G 5/006 375/240.26 |
| 2008/0310315 A1* | 12/2008 | Antonin | ....................... | 370/248 |
| 2009/0097606 A1* | 4/2009 | Hutchins | .................. | H03L 7/07 375/376 |

(Continued)

FOREIGN PATENT DOCUMENTS

| | | | | |
|---|---|---|---|---|
| CN | 103297041 A | 9/2013 | | |
| WO | WO 2013/137863 A1 * | 9/2013 | ............. | H04L 27/32 |

*Primary Examiner* — Sam K Ahn
*Assistant Examiner* — Shawkat M Ali
(74) *Attorney, Agent, or Firm* — McClure, Qualey & Rodack, LLP

(57) ABSTRACT

A serial data link receiver and method are provided. In one implementation, the receiver includes a first equalizer for receiving a first received signal and outputting a first equalized signal, and a second equalizer for receiving a second received signal and outputting a second equalized signal. The receiver further includes an analog CDR (clock-data recovery) circuit for receiving the first equalized signal and outputting a first recovered bit stream and a first recovered clock generated in accordance with an analog control voltage, and a digital CDR circuit for receiving the second equalized signal and the first recovered clock and outputting a second recovered bit stream and a second recovered clock based on selecting a phase of the first recovered clock in accordance with a digital phase selection signal.

20 Claims, 8 Drawing Sheets

(56) References Cited

U.S. PATENT DOCUMENTS

| | | | | |
|---|---|---|---|---|
| 2010/0104057 A1* | 4/2010 | Nedovic | ............... | H04J 3/0685 375/360 |
| 2012/0008727 A1* | 1/2012 | Mohajeri | ................. | H03L 7/06 375/376 |
| 2013/0106515 A1 | 5/2013 | Lin | | |
| 2013/0200931 A1* | 8/2013 | Kono | ........................... | 327/150 |
| 2013/0216014 A1* | 8/2013 | Kong et al. | .................... | 375/376 |
| 2013/0222067 A1* | 8/2013 | Yin et al. | ........................ | 331/25 |
| 2013/0262909 A1* | 10/2013 | Yang | ........................ | G06F 1/08 713/501 |

\* cited by examiner

MULTI-LANE SERIAL DATA LINK RECEIVER AND METHOD THEREOF

BACKGROUND OF THE INVENTION

1. Field of the Invention

The present invention relates to multi-lane serial data links

2. Description of Related Art

Binary signaling is a popular signaling scheme widely used in serial data link; for instance, HDMI (High Definition Multi-media interface). In a serial data link, a bit stream is transmitted from a transmitter to a receiver via a communication channel (e.g. a cable) at a certain symbol rate $f_s$ in accordance with a timing of a clock of the transmitter; each symbol within the bit stream represents either a logical "1" or a logical "0" datum (hereafter, "1" and "0"); a "1" is represented by a voltage of a first level of a symbol duration $T_s$, where $T_s=1/f_s$, while a "0" is represented by a voltage of a second level of the symbol duration $T_s$; and as a result, the bit stream is represented by a voltage signal toggling back and forth between the first level and the second level in accordance with the bit stream transmitted. Some serial data links, e.g. HDMI, utilize multiple lanes of communication channels for transmitting multiple bit streams concurrently for a greater throughput.

A functional block diagram of a receiver 100 of a single-lane serial data link is depicted in FIG. 1. Receiver 100 comprises an equalizer 110 for receiving a received signal and outputting an equalized signal, and a CDR (clock-data recovery) circuit 120 for receiving the equalized signal and outputting a recovered clock and a recovered bit stream. CDR circuit 120 comprises a BPD (binary phase detector) 121 for receiving the equalized signal and the recovered clock and outputting the recovered bit stream and a phase error signal, a CDR filter 122 for receiving the phase error signal and outputting a clock control signal, and a clock generation circuit 123 for receiving the clock control signal and outputting the recovered clock.

An exemplary timing diagram of receiver 100 is shown in FIG. 2. As shown in FIG. 2, the received signal is dispersed due to dispersion caused by the communication channel and therefore the binary nature of the signal is obscured. Equalizer 110 of FIG. 1 is used to equalize the received signal, so that the dispersion is corrected and the resultant equalized signal has two distinct levels representing the bit stream transmitted by the transmitter. CDR circuit 120 of FIG. 1 is used to properly establish a timing of the recovered clock, so that a rising edge of the recovered clock is aligned with a center of a datum bit of the bit stream (see 201, 202, 203, 204, 205, 206, 207, 208) and a falling edge of the recovered clock is aligned with a transition of the bit stream (see 211, 212, 213, 214). The recovered bit stream is conveniently generated by sampling the equalized signal using the rising edge of the recovered clock. In the meantime, an edge sample obtained by sampling the equalized signal using the falling edge of the recovered clock is used to generate the phase error signal. Ideally, a falling edge of the recovered clock is aligned with a bit transition of the bit stream and therefore the resultant edge sample should have no statistical correlation with the bit stream. If the edge sample sides with the recovered bit prior to the transition, it suggests a timing of the recovered clock is too early; if the edge sample sides with the recovered bit following the transition, it suggests the timing of the recovered clock is too late. In this manner, the phase error signal is generated by BPD 121 and serves to adjust the timing of the recovered clock. The phase error signal is filtered by CDR filter 122, resulting in the clock control signal. The clock generation circuit 123 generates the recovered clock in accordance with the clock control signal. The recovered clock is thus controlled in a closed loop manner so as to align with the timing of the equalized signal.

Receiver 100 of FIG. 1 is useful for a single-lane serial data link. For a multi-lane serial data link comprising, for instance, four lanes, four of such receivers are needed, one for each of the four lanes. In this case, one can simply use four copies of the receiver 100 for FIG. 1.

There are generally two schemes for embodying CDR circuit 120 of FIG. 1: one is an analog scheme, and the other is a digital scheme. In the analog scheme, the intermediate signals involved are analog in nature: the phase error signal is usually a current-mode signal; the CDR filter 122 is usually a load circuit comprising a serial connection of a resistor and a capacitor; the clock control signal is usually a voltage signal; and the clock generation circuit 123 is usually a VCO (voltage-controlled oscillator). In the digital scheme, the intermediate signals involved are digital in nature: the phase error signal is usually a ternary digital signal; the CDR filter 122 is a digital filter usually comprising two multipliers, one accumulator, and one adder; the clock control signal is usually a phase selection code specifying a clock phase to be selected; and the clock generation circuit 123 usually comprises a phase selection circuit that selects a clock phase among a plurality of clock phases of a multi-phase clock in accordance with the phase selection code. The digital scheme is attractive due to its digital nature, lending itself to ease of design using design automation tools (i.e., logic synthesis and automatic place and route). Besides, compared to the analog scheme, the performance of the digital scheme is more consistent, more predictable, and less sensitive to noise and variation of supply voltage and temperature. Unfortunately, for high-speed serial links of interest (such as HDMI), the symbol rate is too high for the CDR circuit to operate at the same clock rate (as the symbol rate of the serial link). For this reason, people are forced to resort to block processing, where the phase error signal is buffered and then processed as a block; this allows the CDR circuit to operate at a lower clock rate than the symbol rate of the serial link. For instance, if the block size is ten, then the phase error signal is buffered and processed, ten samples at a time, at a ten-time slower rate than the symbol rate. The drawback, however, is that this introduces a latency in the CDR circuit and degrades the performance of the clock recovery. Therefore, the analog scheme usually has a higher ceiling in performance for clock recovery. However, the digital scheme is more amenable to the process migration of modern CMOS (complementary metal oxide semiconductor) technologies, and can effectively take advantage of the ever increasing circuit speeds and shrinking circuit sizes. The analog scheme, on the other hand, is not as amenable to the process migration, and thus is generally not as power and size efficient as the digital scheme.

BRIEF SUMMARY OF THIS INVENTION

What is disclosed is a method to use a combination of the analog scheme and the digital scheme of clock-data recovery for a multi-lane serial link receiver to get the benefits of both approaches out of the two schemes.

In an embodiment, an apparatus comprises: a first equalizer for receiving a fist received signal and outputting a first equalized signal; a second equalizer for receiving a second received signal and outputting a second equalized signal; an analog CDR (clock-data recovery) circuit for receiving the first equalized signal and outputting a first recovered bit stream and a first recovered clock generated in accordance with an analog control voltage; and a digital CDR circuit for receiving the second equalized signal and the first recovered clock and outputting a second recovered bit stream and a second recovered clock based on selecting a phase of the first recovered clock in accordance with a digital phase selection signal. In an embodiment, the analog CDR circuit comprises a voltage controlled oscillator for generating the first recovered clock controlled by the analog control voltage. In an embodiment, the digital CDR circuit comprises a phase selection circuit controlled by the digital phase selection signal for selecting a phase of the first recovered clock. In an embodiment, the digital CDR circuit comprises a logic circuit operated at a clock divided down from the second recovered clock.

In an embodiment, an apparatus comprises: a first equalizer for receiving a first received signal and outputting a first equalized signal; a second equalizer for receiving a second received signal and outputting a second equalized signal; an analog CDR (clock-data recovery) circuit for receiving the first equalized signal and outputting a first recovered bit stream and a first recovered clock comprising a plurality of phases; and a digital CDR circuit for receiving the second equalized signal and the first recovered clock and outputting a second recovered bit stream and a second recovered clock, wherein the second recovered clock is generated based on a selection a phase of said plurality of phases of the first recovered clock. In an embodiment, the analog CDR circuit comprises a voltage controlled oscillator for generating the first recovered clock. In an embodiment, the digital CDR circuit comprises a phase interpolator for performing a clock phase interpolation on the first recovered clock to generate the second recovered clock. In an embodiment, the digital CDR circuit comprises a logic circuit operated at a clock divided down from the second recovered clock.

In an embodiment, an apparatus comprises: a first equalizer for receiving a first received signal and outputting a first equalized signal; a second equalizer for receiving a second received signal and outputting a second equalized signal; an analog CDR (clock-data recovery) circuit for receiving the first equalizer and outputting a first recovered bit stream and a first recovered clock; and a digital CDR circuit for receiving the second equalized signal and the first recovered clock and outputting a second recovered bit stream, wherein the first recovered clock is generated by a voltage controlled oscillator controlled by an analog control voltage established in a closed-loop manner so that a timing of the first recovered clock aligns with a timing of the first equalized signal, and the second recovered clock is generated via a phase selection of the first recovered clock in accordance with a digital phase selection signal established in a closed-loop manner so that a timing of the second recovered clock aligns with a timing of the second equalized signal.

In an embodiment, a method comprises: receiving a first received signal and a second received signal; equalizing the first received signal and the second received signal into a first equalized signal and a second equalized signal, respectively; performing a clock-data recovery operation on the first equalized signal using an analog scheme comprising a voltage controlled oscillator for outputting a first recovered bit stream and a first recovered clock; and performing a clock-data recovery operation on the second equalized signal using a digital scheme comprising a clock phase selection among a plurality of phases of the first recovered clock to output a second recovered bit stream and a second recovered clock. In an embodiment, the second recovered clock is an interpolation of two phases among said plurality of phases of the first recovered clock. In an embodiment, the digital scheme comprises operating a logic circuit at a clock divided down from the second recovered clock.

DETAILED DESCRIPTION OF THIS INVENTION

Figure 1:
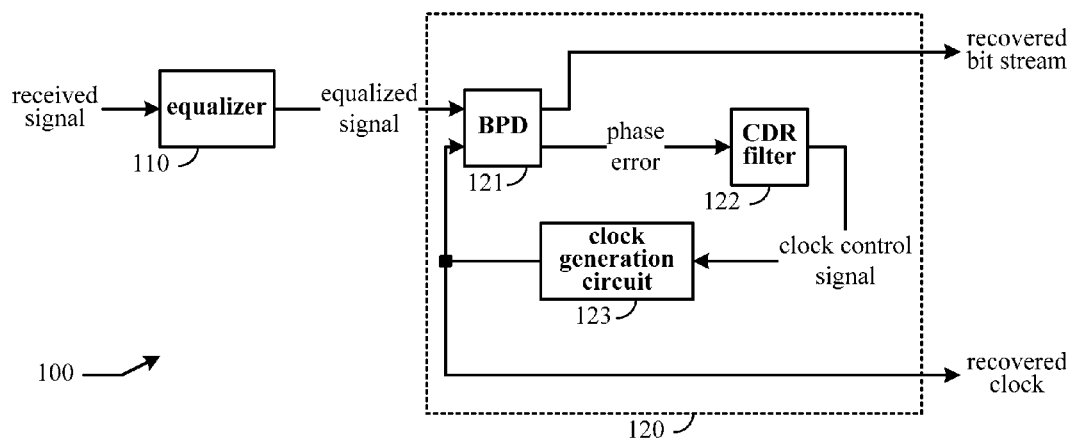
FIG. 1 shows a functional block diagram of a receiver for a serial data link.
Figure 2:
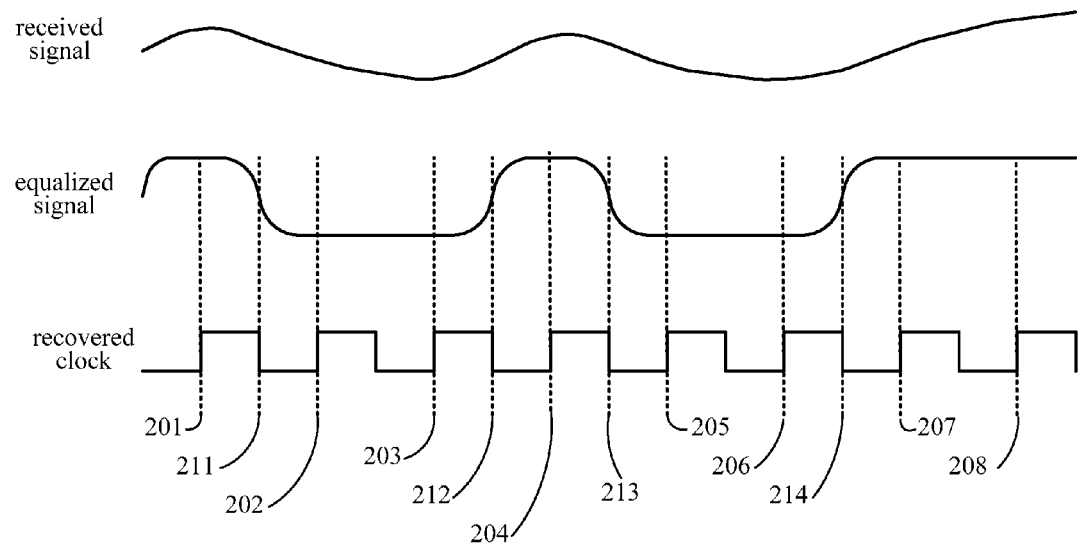
FIG. 2 shows an exemplary timing diagram for the receiver of FIG. 1.

The present invention is directed to multi-lane serial link receivers. While the specifications described several example embodiments of the invention considered best modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

In this disclosure, a CDR (clock-data recovery) circuit/scheme is said to be an analog CDR circuit/scheme if it utilizes a voltage controlled oscillator controlled by an analog voltage to generate a recovered clock that is adjusted in a closed loop manner by establishing a proper value for the analog voltage; a CDR circuit/scheme is said to be a digital CDR circuit/scheme if it utilizes a phase selection circuit (or clock phase selector) controlled by a digital (or numeric) phase selection signal to generate a recovered clock (out of a multi-phase clock) that is adjusted in a closed loop manner by establishing a proper value for the phase selection signal.

By way of example but not limitation, a four-lane serial data link is considered. A four-lane serial data link comprises transmitting four separate bit streams concurrently from a transmitter side to a receiver side via four communication channels, respectively. Despite transmitting four separate bit streams, the transmitter side utilizes a common clock source for a timing reference, usually from an output of a phase lock loop that is locked to a timing of a local crystal oscillator. Therefore, upon reception on the receiver side, the four bit streams track one another in timing, albeit with a respective timing skew due to a mismatch in channel length among the four communication channels. By taking advantage of this property, an embodiment of a four-lane receiver 300 is disclosed and shown in FIG. 3. The four-lane receiver 300 comprises: a first equalizer 310 for receiving a first received signal R0 and outputting a first equalized signal S0; an analog CDR circuit 320 for receiving the first equalized signal S0 and outputting a first recovered clock CK0 and a first recovered bit stream D0; a second equalizer 311 for receiving a second received signal R1 and outputting a second equalized signal S1; a first digital CDR circuit 321 for receiving the second equalized signal S1 and the first recovered clock CK0 and outputting a second recovered clock CK1 and a second recovered bit stream D1; a third equalizer 312 for receiving a third received signal R2 and outputting a third equalized signal S2; a second digital CDR circuit 322 for receiving the third equalized signal S2 and the first recovered clock CK0 and outputting a third recovered clock CK2 and a third recovered bit stream D2; and a fourth equalizer 313 for receiving a fourth received signal R3 and outputting a fourth equalized signal S3; a third digital CDR circuit 323 for receiving the fourth equalized signal S3 and the first recovered clock CK0 and outputting a fourth recovered clock CK3 and a fourth recovered bit stream D3. The analog CDR circuit 320 is designed to attain a high performance in clock recovery, so that the first recovered clock CK0 tracks well with the timing reference upon which the timing of the first received signal R0 was originally established on the transmitter side.

As described herein, using the analog scheme allows a higher ceiling in performance in clock recovery. Besides, the timing of the first received signal R0 tracks well with the timings of the second received signal R1, the third received signal R2, and the fourth received signal R3, respectively, albeit with a respective timing skew. Therefore, the first recovered clock CK0 also tracks well with the timings of the second received signal R1, the third received signal R2, and the fourth received signal R3, respectively, albeit with a respective timing skew. Therefore, when the first recovered clock CK0 is provided to the first digital CDR circuit 321, the second digital CDR 322, and the third digital CDR circuit 323 as a timing reference, all the three digital CDR circuits (321, 322, and 323) need is to detect the respective timing skews between the first received signal R0 and the other three received signals (R1, R2, and R3). This greatly eases the task of clock recovery for the three digital CDR circuits (321, 322, and 323), and thus enables them to have good performance of clock recovery despite using a digital scheme. As a result, the shortcoming of using the digital scheme is circumvented while the advantages can be fully capitalized. By using one analog CDR circuit (320) and three digital CDR circuits (321, 322, and 323), the four-lane receiver 300 get the best of both worlds out of the analog scheme and the digital scheme of CDR.

Figure 3:
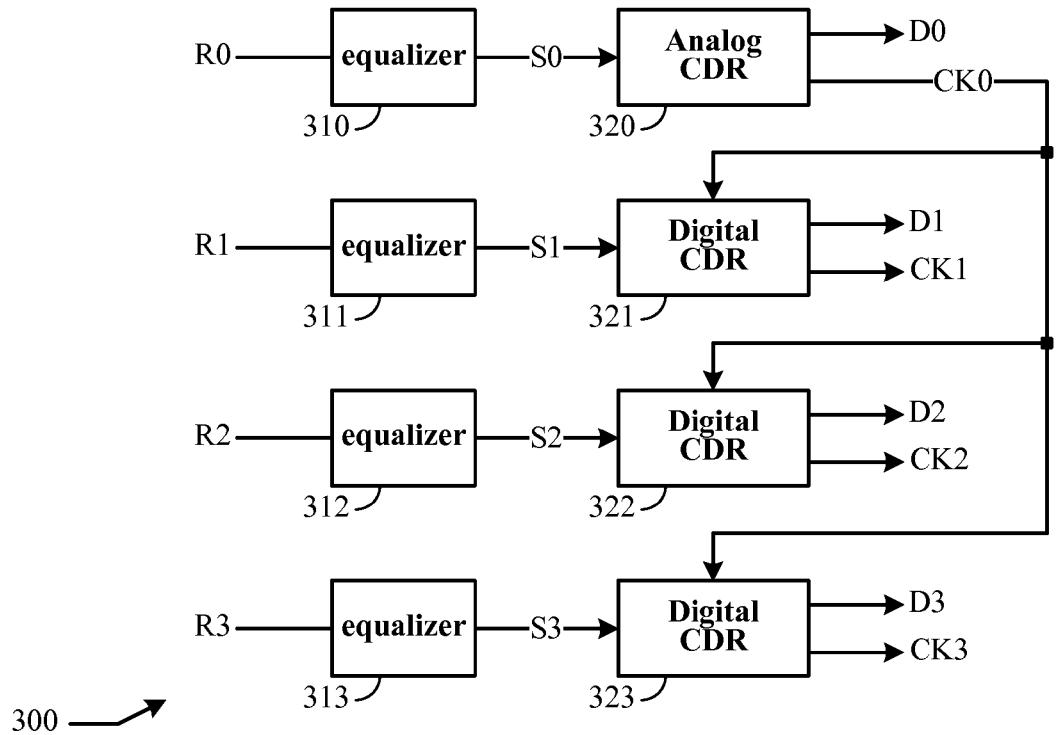
FIG. 3 shows a functional block diagram of a four-lane receiver in accordance with an embodiment of this present invention.
Figure 4:
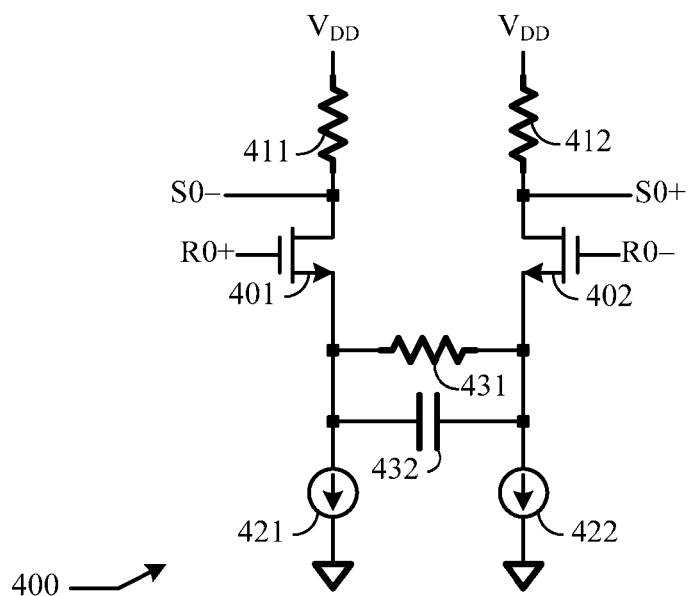
FIG. 4 shows a schematic diagram of an equalizer suitable for use for the four-lane receiver of FIG. 3.

An equalizer 400 suitable for embodying equalizer 310 of FIG. 3 is depicted in FIG. 4. Equalizer 400 employs a differential signaling scheme, where the first received signal R0 comprises a positive end R0+ and a negative end R0−, and the first equalized signal S0 comprises a positive end S0+ and a negative end S0−. Equalizer 400 comprises a differential pair comprising two NMOS (n-channel metal oxide semiconductor) transistors 401 and 402 for providing a gain, two resistors 411 and 412 for providing a load, two current sources 421 and 422 for providing a bias, and a parallel-RC circuit comprising resistor 431 and capacitor 432 for providing a source degeneration. Throughout this disclosure, $V_{DD}$ denotes a power supply node. The circuit of equalizer 400 is well known to those of ordinary skills in the art and thus not described in detail here. The same circuit of equalizer 400 can be used for embodying equalizers 311, 312, and 313 of FIG. 3.

Figure 5A:
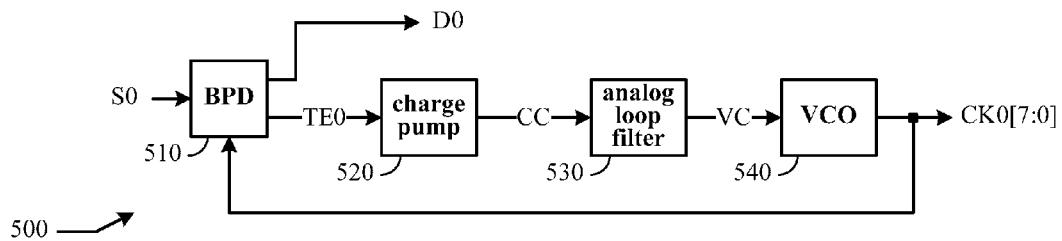
FIG. 5A shows a functional block diagram of an analog CDR circuit suitable for use for the four-lane receiver of FIG. 3.
Figure 5B:
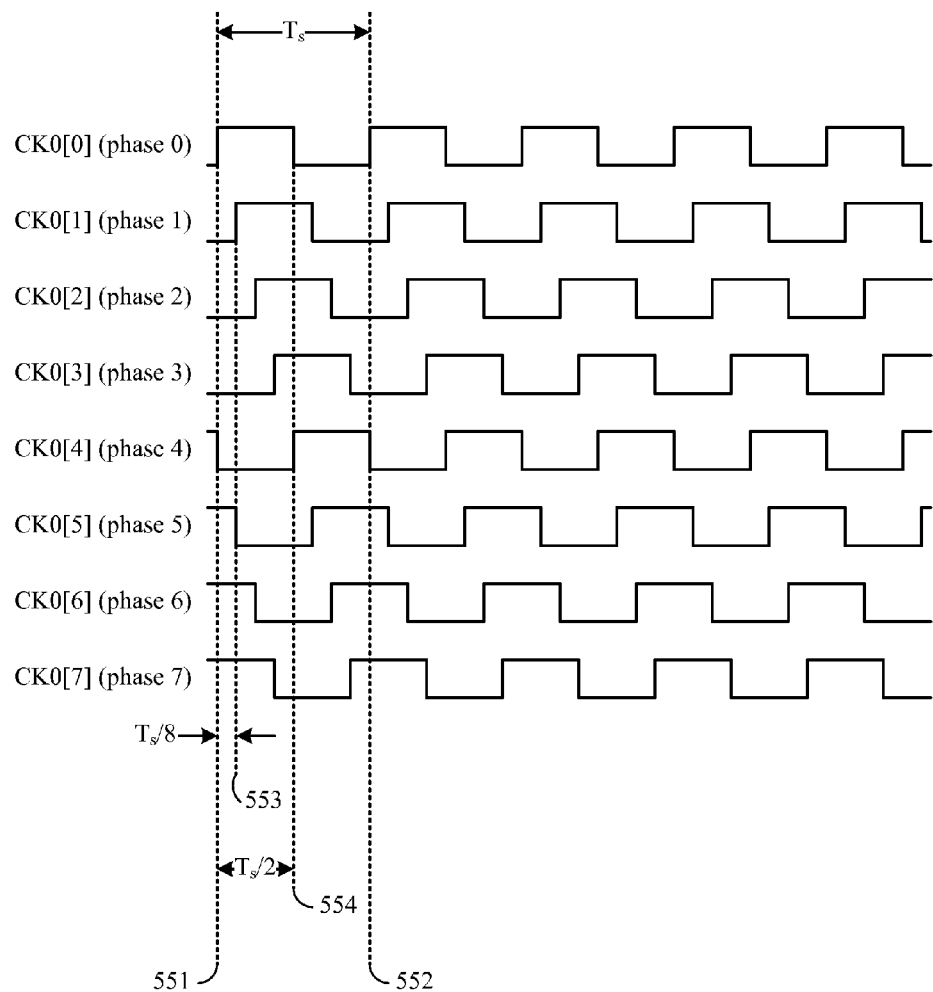
FIG. 5B shows an exemplary timing diagram of an eight phase clock for the analog CDR circuit of FIG. 5A.

A functional block diagram of an analog CDR 500 suitable for embodying the analog CDR circuit 320 of FIG. 3 is shown in FIG. 5A. Analog CDR 500 comprises: a BPD (binary phase detector) 510 for receiving the first equalized signal S0 and the first recovered clock CK0[7:0] (by way of example but not limitation, CK0 is an eight-phase clock, thus expressed as CK0[7:0]) and outputting the first recovered bit stream D0 and a first timing error signal TE0; a charge pump 520 for receiving the first timing error signal TE0 and outputting a correction current signal CC; an analog loop filter 530 for receiving the correction current signal CC and outputting a control voltage VC; and a voltage controlled oscillator (VCO) 540 for receiving the control voltage VC and outputting the first recovered clock CK0[7:0]. A timing diagram for the first recovered clock CK0[7:0] is shown in FIG. 5B. The first recovered clock CK[7:0] is an eight-phase clock comprising eight phases (phases 0, 1, 2, 3, . . . , 7) that are evenly displaced in time over a clock period $T_s$. As shown, the time difference is $T_s$ between a rising edge 551 and the next rising edge 552 for CK0[0] (phase 0). The time difference is $T_s/8$ between the rising edge 551 of CK0[0] (phase 0) and the rising edge 553 of CK0[1] (phase 1). There are four phase steps between CK0[0] and CK0[4], therefore the time difference is $T_s/2$ between the rising edge 551 of CK0[0] (phase 0) and the rising edge 554 of CK0[4] (phase 4).

Figure 5C:
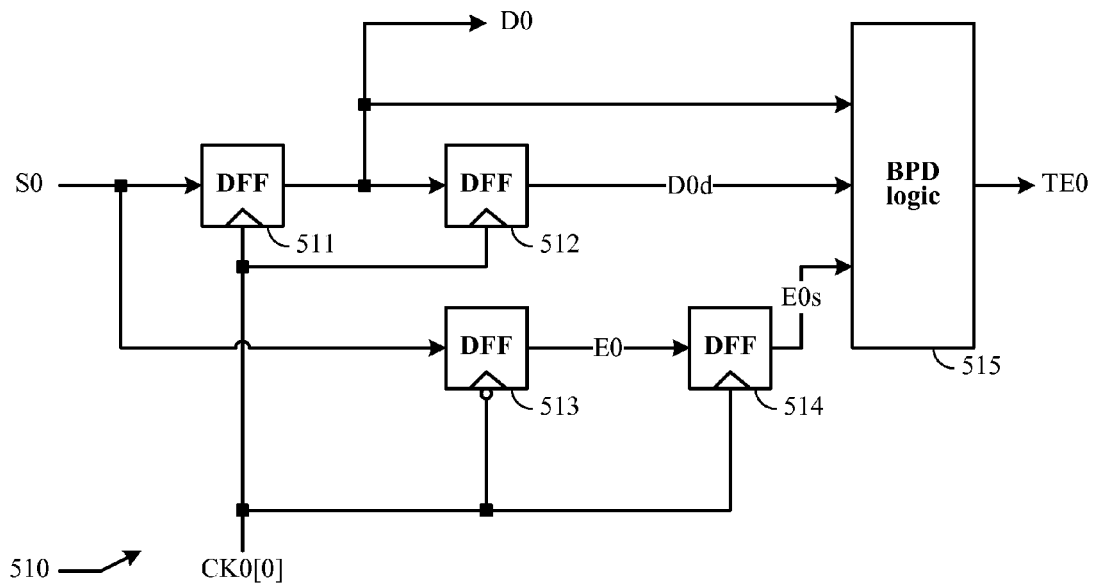
FIG. 5C shows a schematic diagram of a binary phase detector suitable for use for the analog CDR circuit of FIG. 5A.

A functional block diagram of BPD 510 of FIG. 5A is depicted in FIG. 5C. BPD 510 comprises: a first DFF (data flip-flop) 511 triggered at a rising edge of CK0[0] for receiving the first equalized signal S0 and outputting the first recovered bit stream D0; a second DFF 512 triggered at a rising edge of CK0[0] for receiving the first recovered bit stream D0 and outputting D0d, which is a unit-cycle delay of the first recovered bit stream D0; a third DFF 513 triggered at a falling edge of CK0[0] for receiving the first equalized signal S0 and outputting an edge sample E0; a fourth DFF 514 triggered at a rising edge of CK0[0] for receiving the edge sample E0 and outputting a synchronized edge sample E0s ; and a BPD logic unit 515 for receiving D0, D0d, and E0s and outputting the first timing error signal TE0, which is a ternary signal having one of three possible values: 0, 1, and −1. The BPD logic unit 515 is a logical circuit implementing a logical operation described in a C-language code shown below:

```
If D0==D0d
    TE0 = 0;
else if E0s==D0
    TE0 = 1;
else TE0 = −1;
```

In a circuit implementation, the first timing error signal TE0 is represented by a first logical signal UP and a second logical signal DN (note that a logical signal has one of two possible values: 1 and 0). When TE0 is 0, both UP and DN are 0; when TE0 is 1, UP is 1 and DN is 0; and when TE0 is −1, UP is 0 and DN is 1.

Figure 5D:
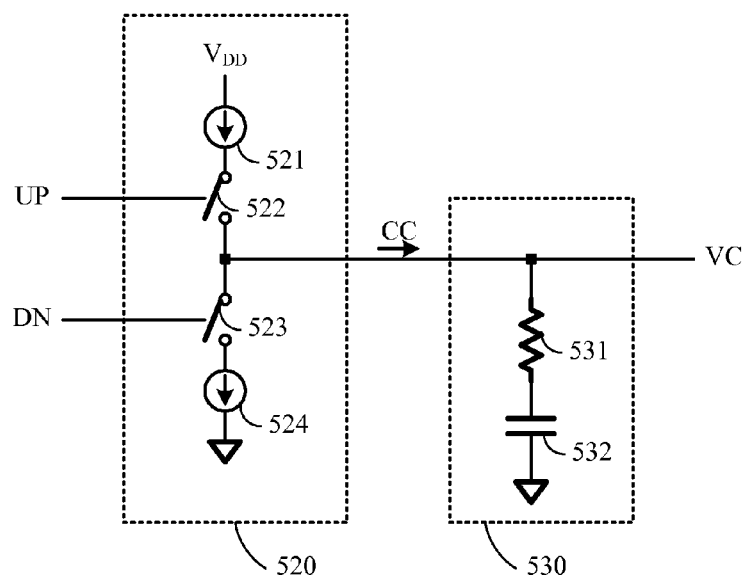
FIG. 5D shows a schematic diagram of a charge pump circuit and a analog loop filter suitable for use for the analog CDR circuit of FIG. 5A.

A schematic diagram of charge pump 520 and analog loop filter 530 of FIG. 5A is shown in FIG. 5D. Charge pump 520 comprises: a current source 521; a first switch 522 controlled by the first logical signal UP; and second switch 523 controlled by the second logical signal DN; and a current sink 524. The resultant correction current signal CC is a current-mode signal. Note that, as described earlier, UP and DN are two logical signals that represent the first timing error signal TE0. When UP and DN are both 0, both switches 522 and 523 are open and therefore the correction current CC is zero. When UP is 1 and DN is 0, the correction current CC is positive (i.e. the current is flowing from charge pump 520 to analog loop filter 530). When UP is 0 and DN is 1, the correction current CC is negative (i.e. the current is flowing from analog loop filter 530 back into charge pump 520). Analog loop filter 530 comprises a series connection of a resistor 531 and a capacitor 532, effectively converting the correction current CC into the control voltage VC.

Figure 5E:
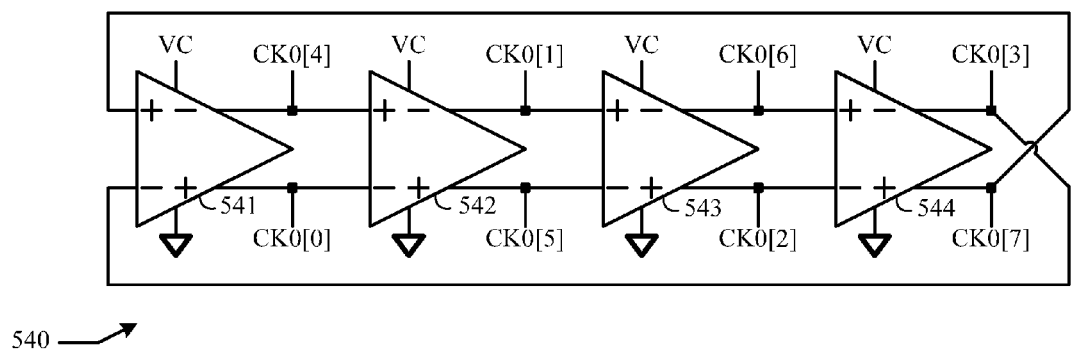
FIG. 5E shows a schematic diagram of a voltage controlled oscillator suitable for use for the analog CDR circuit of FIG. 5A.

A schematic diagram for VCO 540 of FIG. 5A is depicted in FIG. 5E. VCO 540 is a four-stage ring oscillator comprises four voltage controlled delay cells 541, 542, 543, and 543 configured in a ring topology, for receiving the control voltage VC and outputting the eight-phase clock CK0[7:0]. Each of the four voltage controlled delay cells receives a differential input signal comprising a positive end and a negative end from a preceding stage and outputting a differential output signal comprising a positive end and a negative end to a succeeding stage. For instance, voltage controlled delay cell 541 received the differential input signal comprising a positive end CK0[7] and a negative end CK0[3] and outputting the differential output signal comprising a positive end CK0[0] and a negative end CK0[4]. Each of the four voltage controlled delay cells can be embodied by the voltage controlled delay circuit disclosed in US Patent Application Publication US2013/0106515.

Figure 6A:
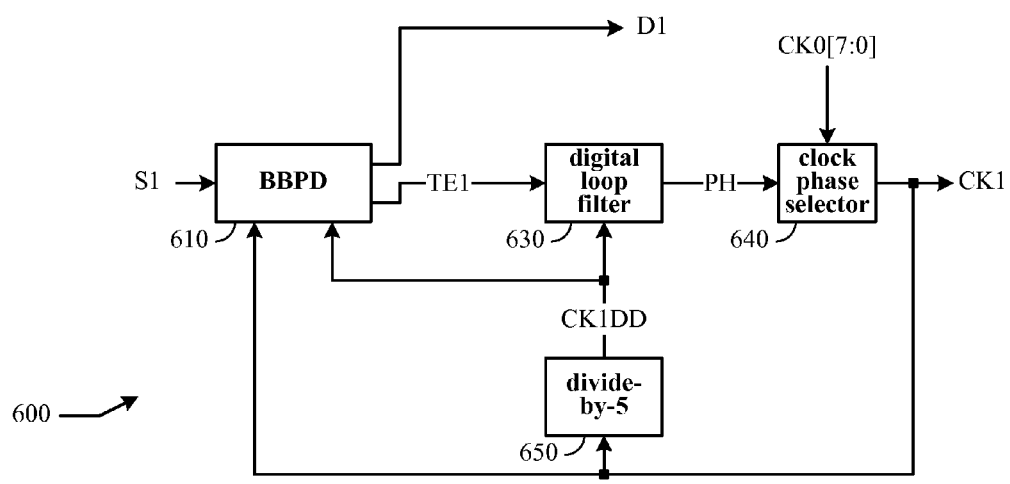
FIG. 6A shows a functional block diagram of a digital CDR circuit suitable for use for the four-lane receiver of FIG. 3.

A functional block diagram of an exemplary digital CDR circuit 600 suitable for embodying digital CDR circuit 321 of FIG. 3 is shown in FIG. 6A. Digital CDR circuit 600 comprises: a block binary phase detector (BBPD) 610 for receiving the second equalized signal S1 and outputting the second recovered bit stream D1 and the second timing error signal TE1 in accordance with the second recovered clock CK1 and a divided-down clock CK1DD; a digital loop filter 630 for receiving the second timing error signal TE1 and outputting a phase selection signal PH in accordance with the divided-down clock CK1DD; a clock phase selector 640 for receiving the phase selection signal PH and the first recovered clock CK0[7:0] and outputting the second recovered clock CK1; and a divide-by-5 circuit 650 for receiving the second recovered clock CK1 and outputting the divided-down clock CK1DD. BBPD 610 employs block processing, where in this exemplary embodiment every 5 (five) symbols are processed as a block, so as to allow the digital loop filter 630 to operate at the divided-down clock CK1DD that is five-time lower in speed than the symbol rate of the bit stream embedded in the second equalized signal S1. Note that in this exemplary embodiment, the block size of the block processing is 5 (five), which is by way of example but not limitation.

Figure 6B:
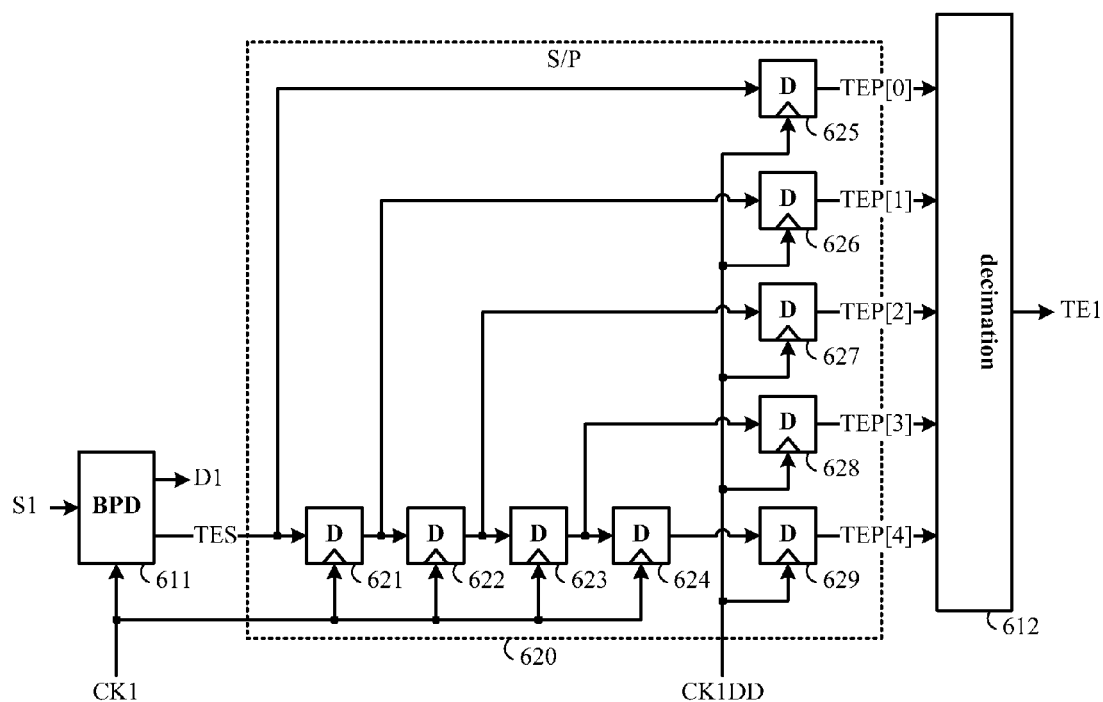
FIG. 6B shows a schematic diagram of a block binary phase detector suitable for use for the digital CDR circuit of FIG. 6A.

A functional block diagram of BBPD 610 of FIG. 6A is shown in FIG. 6B. BBPD 610 comprises: a BPD (binary phase detector) 611 for receiving the second equalized signal S1 and outputting the second recovered bit stream D1 and a serial timing error signal TES in accordance with the second recovered clock CK1; a S/P (serial-to-parallel converter) 620 for converting the serial timing error signal TES, which is in a clock domain of the second recovered clock CK1, into a parallel timing error signal TEP[4:0], which is in a clock domain of the divided-down clock CK1DD; and a decimation logic 612 for receiving the parallel timing error signal TEP [4:0] and outputting the second timing error signal TE1. BPD 611 can be embodied by BPD 510 of FIG. 5A (by replacing S0, CK0[0], and TE0 with S1, CK1, and TES, respectively.) S/P 620 comprises four data buffers (denoted as D in the figure) 621, 622, 623, and 624 triggered at a rising edge of the second recovered clock CK1, and five parallel data buffers (denoted as D in the figure) 625, 626, 627, 628, and 629 triggered at a rising edge of the divided-down clock CK1DD. In an embodiment, the decimation logic 612 is a logic circuit implementing the following algorithm written in C-language:

```
sum = TEP[0]+TEP[1]+TEP[2] +TEP[3] +TEP[4];
if sum>0
    TE1 = 1;
else if sum<0
    TE1 = −1;
else TE1 = 0;
```

Figure 6C:
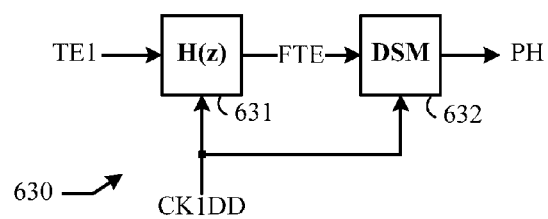
FIG. 6C shows an embodiment of a digital loop filter suitable for use for the digital CDR circuit of FIG. 6A.

In an embodiment shown in FIG. 6C, digital loop filter 630 of FIG. 6A comprises: a digital filter 631(denoted as H(z), clocked by the divided-down clock CK1DD) for receiving the second timing error signal TE1 and outputting a filtered timing error signal FTE; and a delta-sigma modulator (DSM, also clocked by the divided-down clock CK1DD) 632 for receiving the filtered timing error signal FTE and outputting the phase selection signal PH. In an embodiment, the digital filter 631 implements a transfer function H(z) expressed in z-transform shown below:

$$H(z)=K_p+K_i/(1-z^{-1})$$

Here, $K_p$ and $K_i$ are two parameters. In one particular embodiment of preference, $K_i$=0 and therefore $H(z)=K_p$; in this particular embodiment, the digital filter 631 simply comprises a multiplier. DSM 632 is used for truncating the filtered timing error signal FTE so that the resultant phase selection signal PH is compatible with the subsequent clock phase selector 640 of FIG. 6A. Using a delta-sigma modulator for truncating a signal, instead of directly truncating the signal, is a method for lessening an adverse effect of loss of information due to the truncation; this is well known to those of ordinary skills in the art and thus not further described in detail here.

Figure 6D:
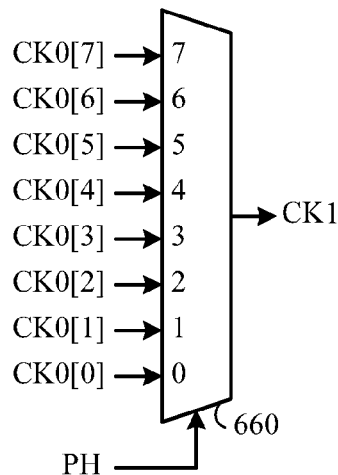
FIG. 6D shows an embodiment of a clock phase selector suitable for use for the digital CDR circuit of FIG. 6A.

A multiplexer 660 suitable for embodying clock phase selector 640 of FIG. 6A is shown in FIG. 6D. Multiplexer 660 is used for selecting a phase of the first recovered clock CK0[7:0], which comprises eight phases, in accordance with the phase selection signal PH. To be compatible with using multiplexer 660 to embody clock phase selector 640, the phase selection signal PH must be an integer (this can be fulfilled by generating the phase selection signal PH using a delta-sigma modulator, as shown in FIG. 6C). Note that due to modulo-8 nature of an eight-phase clock, PH=8 is equivalent to PH=0, PH=9 is equivalent to PH=1, PH=−1 is equivalent to PH=7, and so on, and so forth. Therefore, PH is implicitly confined to eight values: 0, 1, 2, 3, 4, 5, 6, and 7, due to an implicit modulo-8 nature. Multiplexer 660 outputs the second recovered clock CK1 by selecting one of the eight phases of the first recovered clock CK0[7:0] in accordance with a value of the phase selection signal PH. For instance, if PH is 2, CK0[2] is selected for the second recovered clock CK1; if PH is 5, CK0[5] is selected for the second recovered clock CK1.

Figure 6E:
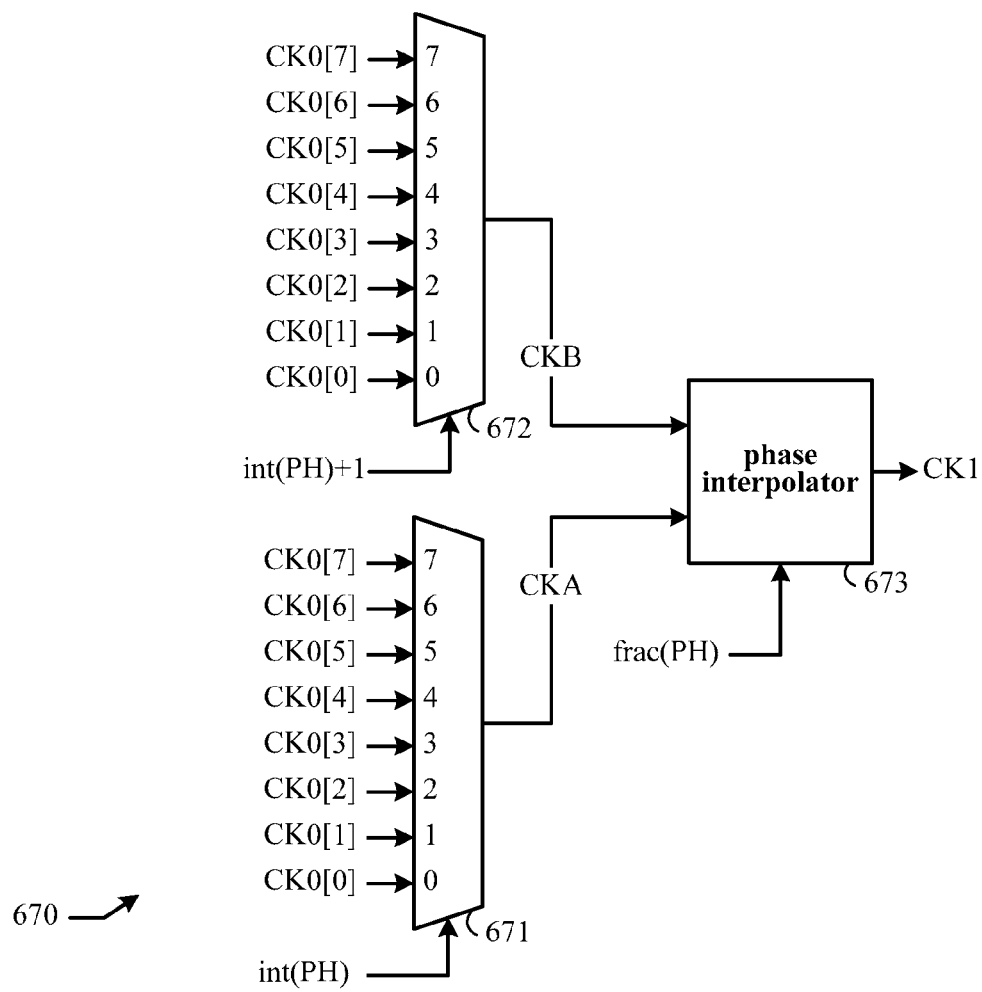
FIG. 6E shows an alternative embodiment of a clock phase selector suitable for use for the digital CDR circuit of FIG. 6A.

In an alternative embodiment shown in FIG. 6E, a clock selection circuit 670 is used for embodying clock phase selector 640 of FIG. 6A. To be compatible with using clock selection circuit 670, the phase selection signal PH comprises an integer part, denoted as int(PH) (which is implicitly confined to eight values: 0, 1, 2, 3, 4, 5, 6, and 7), plus a fractional part, denoted as frac(PH). Clock selection circuit 670 comprises: a first multiplexer 671 for outputting a first selected phase CKA out of CK0[7:0] in accordance with a value of int(PH); a second multiplexer 672 for outputting a second selected phase CKB out of CK0[7:0] in accordance with a value of int(PH)+1 (note that, if int(PH)+1 is equal to 8, then it's the same as 0 due to the modulo-8 nature of the clock phase); and a phase interpolator 673 for outputting the second recovered clock CK1 by performing a phase interpolation between the first selected phase CKA and the second selected phase CKB. By way of example but not limitation, the fractional part frac(PH) is truncated (by a delta-sigma modulator within digital loop filter 630) to be one of four possible values: 0, ¼, ½, and ¾; the phase interpolator 673 performing a phase interpolation by combining (1−frac(PH))×100% of CKA with frac(PH))×100% of CKB. For instance, if PH is 3¼, CK0[3] and CK0[4] are selected for CKA and CKB, respectively (since the integer part is 3), and the second recovered clock CK1 is obtained by combining 75% of CK0[3] with 25% of CK0[4] (since the fractional part is ¼); if PH is 5¾, CK0[5] and CK0[6] are selected for CKA and CKB, respectively (since the integer part is 5), and the second recovered clocked CK1 is obtained by combining 25% of CK0[5] with 75% of CK0[6] (since the fractional part is ¾); if PH is 7½, CK0[7] and CK0[0] are selected for CKA and CKB, respectively (since the integer part is 7), and the second recovered clocked CK1 is obtained by combining 50% of CK0[7] with 50% of CK0[0] (since the fractional part is ½); and if PH is 2, CK0[2] and CK0[3] are selected for CKA and CKB, respectively (since the integer part is 2), and the second recovered clocked CK1 is obtained by combining 100% of CK0[2] with 0% of CK0[3] (since the fractional part is 0). Clock interpolation by combining two neighboring phases of a multi-phase clock with a specified percentage (or ratio) is well known to those of ordinary skills in the art and thus not described in detail here.

Divide-by-5 circuit 650 of FIG. 6A can be embodied by a synchronous counter, which is well known to those of ordinary skills in the art and thus not described in detail here.

The same embodiment of CDR 600 can be used to embody digital CDR 322 and 323 of FIG. 3 by simply changing the interfacing signals accordingly, i.e. replacing S1 with S2 and S3, replacing D1 with D2 and D3, and replacing CK1 with CK2 and CK3, respectively.

Although it is shown in the figure that the first recovered clock CK0 is directly passed to digital CDR circuits 321, 322, and 323, it is just an example of using a timing referenced to first recovered clock CK0 to enhance a performance of digital CDR circuits 321, 322, and 323. Other embodiments are possible without escaping from the scope of this present invention, as long as a timing referenced to the first recovered clock CK0 is utilized by digital CDR circuits 321, 322, and 323. In an alternative embodiment, for instance, instead of directly passing the first recovered clock CK0 to digital CDR circuits 321, 322, and 323, a PLL (phase lock loop), not shown in figure, is inserted to generate a derived clock that is phase locked to the first recovered clock CK0; the derived clock is then passed to digital CDR circuits 321, 322, and 323. This alternative embodiment offers a flexibility of allowing using the PLL to generate the multi-phase clock (that is needed for digital CDR circuits 321, 322, and 323 as described earlier), instead of requiring the analog CDR circuit 320 to directly generate the multi-phase clock. PLL is well known to those of ordinary skills in the art and thus not described in detail here.

Although four-lane receiver 300 is shown in the figure, this present invention can be applied to any M-lane receiver, where M is an integer greater than 1. Of the M lanes, one lane utilizes an analog CDR scheme to generate a first recovered clock, and the rest utilizes a digital CDR scheme referenced to a timing of the first recovered clock.

Figure 7:
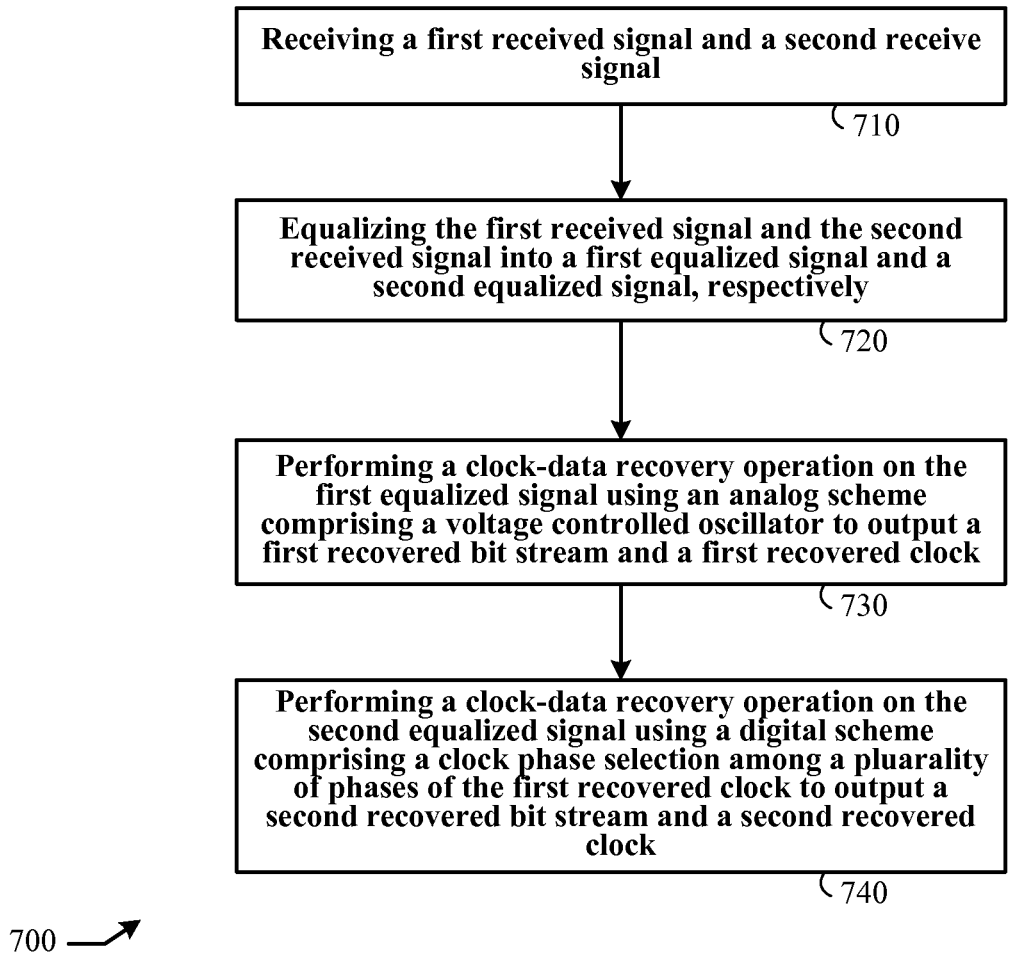
FIG. 7 shows a flow diagram of a method in accordance with an embodiment of the present invention.

In an embodiment, a method illustrated by flow diagram 700 is depicted in FIG. 7. The method illustrated by flow diagram 700 comprises: receiving a first received signal and a second received signal (710); equalizing the first received signal and the second received signal into a first equalized signal and a second equalized signal, respectively (720); performing a clock-data recovery operation on the first equalized signal using an analog scheme comprising a voltage controlled oscillator to output a first recovered bit stream and a first recovered clock (730); and performing a clock-data recovery operation on the second equalized signal using a digital scheme comprising a clock phase selection out of a timing referenced to the first recovered clock to output a second recovered bit stream and a second recovered clock (740).

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. An apparatus comprising:
   a multi-lane receiver for concurrently receiving plural bit streams clocked according to a common clock source, the multi-lane receiver comprising:
   a first equalizer for receiving a first received signal of the plural bit streams and outputting a first equalized signal;
   a second equalizer for receiving a second received signal of the plural bit streams and outputting a second equalized signal;
   an analog CDR (clock-data recovery) circuit for receiving the first equalized signal and outputting a first recovered bit stream and a first recovered clock generated in accordance with an analog control voltage; and
   a digital CDR circuit for receiving the second equalized signal and the first recovered clock and outputting a second recovered bit stream and a second recovered clock based on selecting a phase of the first recovered clock in accordance with a digital phase selection signal.

2. The apparatus of claim 1, wherein the analog CDR circuit comprises:
   a binary phase detector for receiving the first equalized signal and the first recovered clock and outputting the first recovered bit stream and a timing error signal; a charge pump for receiving the timing error signal and outputting a control current; an analog loop filter for receiving the control current and outputting the analog control voltage; and
   a voltage controlled oscillator controlled by the analog control voltage for generating the first recovered clock.

3. The apparatus of claim 2, wherein the voltage controlled oscillator is a ring oscillator comprises a plurality of voltage controlled delay cells.

4. The apparatus of claim 1, wherein the digital CDR circuit comprises:
   a block binary phase detector for receiving the second equalized signal and outputting the second recovered bit stream and a timing error signal in accordance with the second recovered clock and a divided-down clock; a digital loop filter for receiving the timing error signal and outputting the digital phase selection signal; a clock phase selector controlled by the digital phase selection signal for outputting the second recovered clock based on a phase selection of the first recovered clock; and a divider for dividing down the second recovered clock to generate the divided-down clock.

5. The apparatus of claim 4, wherein the clock phase selector comprises a multiplexer.

6. The apparatus of claim 5, wherein the clock phase selector further comprises a phase interpolator.

7. The apparatus of claim 4, wherein the digital loop filter comprises a digital filter and a delta-sigma modulator.

8. An apparatus comprising:
a multi-lane receiver for concurrently receiving plural bit streams clocked according to a common clock source, the multi-lane receiver comprising:
a first equalizer for receiving a first received signal of the plural bit streams and outputting a first equalized signal;
a second equalizer for receiving a second received signal of the plural bit streams and outputting a second equalized signal;
an analog CDR (clock-data recovery) circuit for receiving the first equalized signal and outputting a first recovered bit stream and a first recovered clock; and
a digital CDR circuit for receiving the second equalized signal and the first recovered clock and outputting a second recovered bit stream, wherein the first recovered clock is generated by a voltage controlled oscillator controlled by an analog control voltage established in a closed-loop manner so that a timing of the first recovered clock aligns with a timing of the first equalized signal, and the second recovered clock is generated via a phase selection of the first recovered clock in accordance with a digital phase selection signal established in a closed-loop manner so that a timing of the second recovered clock aligns with a timing of the second equalized signal.

9. The apparatus of claim 8, wherein the analog CDR circuit comprises: a binary phase detector for receiving the first equalized signal and the first recovered clock and outputting the first recovered bit stream and a timing error signal; a charge pump for receiving the timing error signal and outputting a control current; an analog loop filter for receiving the control current and outputting the analog control voltage; and the voltage controlled oscillator controlled by the analog control voltage for generating the first recovered clock.

10. The apparatus of claim 9, wherein the voltage controlled oscillator is a ring oscillator comprises a plurality of voltage controlled delay cells.

11. The apparatus of claim 8, wherein the digital CDR circuit comprises: a block binary phase detector for receiving the second equalized signal and outputting the second recovered bit stream and a timing error signal in accordance with the second recovered clock and a divided-down clock; a digital loop filter for receiving the timing error signal and outputting the digital phase selection signal; a clock phase selector controlled by the digital phase selection signal for outputting the second recovered clock based on a phase selection of the first recovered clock; and a divider for dividing down the second recovered clock to generate the divided-down clock.

12. The apparatus of claim 11, wherein the clock phase selector comprises a multiplexer.

13. The apparatus of claim 12, wherein the clock phase selector further comprises a phase interpolator.

14. The apparatus of claim 11, wherein the digital loop filter comprises a digital filter and a delta-sigma modulator.

15. An method comprising:
concurrently receiving a first received signal and a second received signal over separate communication channels, the first and second received signals clocked by a common clock source;
equalizing the first received signal and the second received signal into a first equalized signal and a second equalized signal, respectively;
performing a clock-data recovery operation on the first equalized signal using an analog scheme comprising using a voltage controlled oscillator to output a first recovered bit stream and a first recovered clock; and
performing a clock-data recovery operation on the second equalized signal using a digital scheme comprising a clock phase selection among a plurality of phases of the first recovered clock to output a second recovered bit stream and a second recovered clock.

16. The method of claim 15, wherein: the voltage-controlled oscillator is controlled by an analog control voltage established in a closed-loop manner to make a timing of the first recovered clock align with a timing of the first equalized signal.

17. The method of claim 16, wherein: the clock phase selection is controlled by a digital phase selection signal established in a closed-loop manner to make a timing of the second recovered clock align with a timing of the second equalized signal.

18. The method of claim 17, wherein the digital phase selection signal is generated by a logic circuit operated at a clock divided down from the second recovered clock.

19. The method of claim 18, wherein the logic circuit comprises a delta-sigma modulator.

20. The method of claim 17, wherein the clock phase selection comprises a phase interpolation of the first recovered clock.

* * * * *